(12) United States Patent
Canelas et al.

(10) Patent No.: US 7,560,519 B2
(45) Date of Patent: Jul. 14, 2009

(54) DUAL-STAGE WAFER APPLIED UNDERFILLS

(75) Inventors: Dorian Canelas, Raleigh, NC (US); Kaylan Ghosh, Cary, NC (US); Amanda W. Kyles, Middlesex, NC (US); Edward Cole, Raleigh, NC (US)

(73) Assignee: Lord Corporation, Cary, NC (US)

( * ) Notice: Subject to any disclaimer, the term of this patent is extended or adjusted under 35 U.S.C. 154(b) by 274 days.

(21) Appl. No.: 10/578,010

(22) PCT Filed: Jun. 2, 2004

(86) PCT No.: PCT/US2004/017749

§ 371 (c)(1),
(2), (4) Date: May 3, 2006

(87) PCT Pub. No.: WO2005/056675

PCT Pub. Date: Jun. 23, 2005

(65) Prior Publication Data

US 2007/0082203 A1     Apr. 12, 2007

(51) Int. Cl.
*C08L 63/00* (2006.01)
*C08L 33/00* (2006.01)
*C08F 2/50* (2006.01)

(52) U.S. Cl. .......................... 525/530; 522/6; 523/400; 525/529; 525/533

(58) Field of Classification Search ................. 428/413, 428/414, 523; 438/106, 108, 118; 525/55, 525/107, 113, 117, 118, 523, 524, 529, 530, 525/533; 522/6, 7; 523/400
See application file for complete search history.

(56) References Cited

U.S. PATENT DOCUMENTS

| | | | |
|---|---|---|---|
| 6,287,745 B1 * | 9/2001 | Yamamura et al. | 430/269 |
| 2003/0080397 A1 * | 5/2003 | Sakuyama et al. | 257/667 |
| 2003/0141592 A1 * | 7/2003 | Ma et al. | 257/743 |
| 2004/0102566 A1 * | 5/2004 | Forray et al. | 524/502 |

* cited by examiner

*Primary Examiner*—Michael J Feely
(74) *Attorney, Agent, or Firm*—Todd W. Galinski

(57) ABSTRACT

A 100% non-volatile, one-part liquid underfill encapsulant is disclosed for application to the active side of a large wafer or integrated circuit chip. Upon coating, the encapsulant is converted to a liquefiable, tack-free solid by exposure to radiation, particularly in the UV, visible and infrared spectrum. The underfill-coated wafer exhibits outstanding shelf aging of months without advancement of cure. The large wafer can be singulated into smaller wafer sections and stored for months after which during solder reflow assembly, the wafer connects are fixed and the underfill liquefies, flows out to a fillet and transitions to a thermoset state on heat activated crosslinking.

9 Claims, 2 Drawing Sheets

DUAL-STAGE WAFER APPLIED UNDERFILLS

FIELD OF THE INVENTION

The invention is directed to microelectronic chip assemblies and in particular, methods and materials for applying an underfill to integrated circuit wafers.

BACKGROUND OF THE INVENTION

Surface mounting of electronic components is well developed in automated package assembly systems. Integrated circuits are made up of devices such as transistors and diodes and elements such as resistors and capacitors linked together by conductive connections to form one or more functional circuits. The devices are built on wafers, or sheets of silicon with a surface that is subject to a series of fabrication steps to form a pattern of identical integrated circuits separated from each other by a repeating rectangular pattern of scribe lines or saw streets in the surface of the wafer that serve as boundaries between the dice, chip or die. At a late stage in a fabrication process the singulated dice from the wafer is bonded to a substrate to form an IC package.

Conventional flip chip technology generally refers to any assembly where the active side of the integrated circuit die is attached to a package substrate or printed circuit board (collectively referred to as a PCB). Flip chip assemblies can be designed either with or without underfill packaging. In connection with the use of flip chips, the chip is provided with small bumps or balls of solder (hereafter "bumps" or "solder bumps") positioned in locations on the active side designed to correspond to the recesses on the surface of the circuit board. The chip is mounted by registering the bumps with the board such that the solder bumps become sandwiched between the pads on the board and the corresponding pads on the chip. After flux is applied, heat is applied to the assembly to a point at which the solder is caused to reflow. Upon cooling, the solder hardens, thereby mounting the flip chip to the board's surface. Conventional underfills are used in several distinct approaches and are applied to a mounted chip to provide protection of the chip against chemical attack, moisture, airborne contaminants, and the like, as well as against mechanical shock, vibration, and temperature cycling encountered in transit as well as use. A conventional capillary flip chip underfill process entails the steps of alignment of chip and circuit board, flux dispensing, solder reflow, flux cleaning, underfill application, underfill flow and curing.

Underfills used in chip packages serve functions to protect the solder joints that interconnect the chip and package or board from environmental factors such as moisture and contaminants and to redistribute mechanical stresses, which in turn increases device lifetime. Protection is provided for the chip against contaminants such as moisture and resulting corrosion of the metal interconnects. However improper selection of adhesives can result in flip chip package failures in several modes, such as shrinkage, delamination, hydrolytic instability, corrosion, and contamination by the underfill.

Chip underfills are designed to avoid imparting stress between the adherends as a result of differential coefficients of thermal expansion between the chip, interconnects, underfill and substrate. Failure modes due to stresses become more prevalent if the substrate is organic and as device size increases. A chip underfill must provide the function of adhering to the substrate, such as a ceramic or organic PCB's (FR4 epoxy, for example), which may or may not be coated with solder mask; metal alloy or organic interconnects; and the integrated circuit die (chip), typically comprised of silicon or other inorganic species and may or may not be coated with a thin passivation layer.

In one of two principle ways to package electronic components, the components are soldered to the same side of the board upon which they are mounted. These devices are said to be "surface-mounted". Two types of conventional underfills are in practice for use with surface-mounted devices: capillary flow and "no flow" types. Detailed descriptions of these technologies can be found in the literature. For example, see John H. Lau's book *Low Cost Flip Chip Technologies for DCA, WLCSP and PBGA Assemblies*, McGraw-Hill, 2000. For both of these technologies, heat is typically used to either cure a liquid thermosetting formulation or laminate a solid film into the assembly. Vacuum is sometimes used to remove air voids from the system. The underfill is typically applied on the surface mount (SMT) assembly line for chip in-package or chip on-board. The use of the traditional flow and no-flow underfills requires several steps on the SMT line, and this process is usually the bottleneck on these microelectronics assembly lines.

A representative conventional no-flow underfill is disclosed in U.S. Pat. No. 6,180,696. The underfill material is first dispensed on the substrate or the semiconductor chip followed by solder bump reflowing and underfill encapsulant curing simultaneously. The underfill taught in U.S. Pat. No. 6,180,696 comprises epoxy resin and/or a mixture of epoxy resins, an organic carboxylic acid anhydride hardener, a curing accelerator, a self-fluxing agent, a viscosity-controlling agent, a coupling agent, and a surfactant. The underfill formulations exhibit a curing peak temperature ranging from 180 to 240° C. These underfills must be stored at sub-zero temperatures (° C.) to prevent advancement of cure.

Underfills are distinguished from imageable photoresist materials as patterned formations coated on PC boards, however some similarity lies in the use of ubiquitous epoxy resins. Coatings for photoresist applications are known to employ a photoinitiator to cure in the regions exposed through a mask to activating radiation, and a secondary thermal activated free radical cure component to effect polymerization in unirradiated or shadow areas. One secondary cure mechanism commonly utilized relies upon the addition of a heat-activated peroxide to the formulation; and temperatures in excess of 100° C. are however normally required to initiate peroxide-induced polymerizations, thus precluding use where, for example, heat-sensitive electronic components are involved.

U.S. Pat. No. 5,077,376 discloses epoxy adhesives containing latent thermal curing components. The '376 disclosure teaches the known shelf stability problems of liquid epoxies which led to wide-spread use of epoxy-resin compositions that contain a latent hardener such as dicyandiamide, dibasic acid dihydrazides, boron trifluoride-amine adducts, guanamines, melamines, and the like. However, it is taught that dicyandiamides, dibasic acid dihydrazides and guanamines are defective in that they require high temperatures of 150° C. or higher in order to cure.

U.S. Pat. No. 5,523,443 discloses dual curing conformal coatings, which contain a ultraviolet curable polymerizable system and a moisture curing mechanism. The polymerizable coating system is a one component system comprising at least one alkoxysilyl-urethane-acrylate or methacrylate, an acrylate or methacrylate or vinyl ether diluent, a polymerization initiator of the cationic or free radical photoinitiator type, and a metal catalyst.

U.S. Pat. No. 5,249,101 (IBM, 1993) teaches that the brittleness of protective epoxy coatings for the circuitry on the circuitized surfaces of chip carriers, with moduli of elasticity greater than about 10,000 psi (69 MPa), lead to cracking and delamination. U.S. '101 proposed a coating comprising acrylated urethane oligomer, acrylated monomer and photoinitiator to provide coatings having moduli of elasticity equal to or less than about 10,000 p.s.i. and having chloride ion concentrations less than 10 ppm. Acrylated urethane wafer applied underfill will not survive a solder reflow as it lacks sufficient heat resistance.

U.S. Pat. No. 5,494,981 discloses a curable combination of cycloaliphatic epoxy resin, a cyanate ester resin, optionally a polyol, and, as initiator, a Brönsted acid. When cured, the compositions provide interpenetrating polymer networks (IPNs). The IPNs are useful as high temperature stable vibration damping materials, adhesives, binders for abrasives, and protective coatings.

U.S. Pat. No. 5,672,393 discloses an acrylate encapsulation formulation, which reacts at a high rate of speed, when exposed to radiation inclusive of wave-lengths in the ultraviolet and the visible range, to initially produce a relatively thick skin and to ultimately cure to a relatively low-stress deposit having good physical definition and surface properties. The method entails exposure of the formulation, on an object, to radiation for initiating photopolymerization and thermal polymerization, and the apparatus includes closely juxtaposed actinic radiation and thermal energy sources. The catalyst system includes a photoinitiator component and a thermal initiator component which is responsive to temperatures below 120° C.

U.S. Pat. No. 5,706,579 discloses a method of assembling integrated circuit packages fabricated from a die, printed wiring board and metal lid, using a beta-stageable resin which is preapplied to the lid and which contains a thermally conductive filler material. With the lid in place over the die and substrate board, the package is heated to cause the resin to flow and establish contact with the die. Further heating causes curing of the resin and a permanent thermal bridge between the die and the lid.

U.S. Pat. No. 6,194,788 discloses an integrated thermoplastic, self-fluxing two-part underfill for flip chips. The underfill comprises epoxy resin and acetate diluent with a fluxing type acidic epoxy curative.

U.S. Pat. No. 6,323,062 (Alpha Metals, filed Sep. 14, 1999) discloses a method for applying an solvent-based underfill to a flip chip. The method includes the steps of adhering a bumped wafer to an expandable carrier substrate, first sawing the wafer to form individual chips, stretching the carrier substrate in a bidirectional manner to form channels between each of the individual chips, followed by applying an underfill material to the bumped surfaces of the chips and around the edges of the chips. The underfill materials are not disclosed, but it is taught that the underfill is allowed to dry after coating, followed by cutting the underfill material in the channels between the chips and removing the individual, underfill coated chips from the carrier.

U.S. Pat. No. 6,383,659 discloses b-stage films of a low Tg epoxy-based underfill that contains a thermoplastic polymer having a MW of from 5,000 to 200,000. The '659 patent also teaches that epoxy resin compositions of the self-polymerization type, typically containing imidazoles or phenolic curing types exhibit limited shelf stability, moisture resistance and high-temperature performance of cured compositions, and are difficult to control the progress of the B-stage reaction.

The above prior art exemplifies dual curing approaches to forming coatings, but do not relate to storage of b-stage coating containing a second cure chemistry on fragile substrates such as silicon wafers. Wafer distortion, breakage, and long term ambient storage at temperatures easily reaching about 50° C. are possible in transit or storage, except in controlled environments.

The problems encountered in wafer-applied underfills when the underfill is applied and cured followed by a delay of months until the solder reflow step for a dual-stage curing underfill entails: initial wetting and adhesion of the liquid coating; solidification of the coating at ambient temperatures without delamination from the wafer; long term ambient temperature storage of the coated wafer without loss of re-flow capability from advancement of cure or gel content; avoidance of delamination from the wafer during singulation or dicing; the ability to be stenciled within wafer saw streets; slow onset of thickening during the initial heating from solder reflow; where a surrounding collar is not used, the ability of the underfill to flow out and around the chip forming a fillet; the absence of voids in the underfill after a solder re-flow step; and long-term reliability (defect-free) in devices during their useful service life.

All of these technical problems identified with wafer-applied underfilling for long term storage prior to assembly are not addressed by prior art underfill materials. The objective is therefore to provide materials and methods for decoupling underfill application and flip chip assembly whereby a liquid underfill is coated by conventional coating methods directly to the active side of a large wafer, for example, a wafer having a surface area of 100-500 mm$^2$ and larger, followed by solidification and storage of the coated wafer or diced sections for prolonged periods, such as several months. In this instance, the subsequent wafer attaching processes must avoid problems with respect to the properties of the aged underfill.

SUMMARY OF THE INVENTION

The invention is directed to a wafer-underfill assembly and method for applying a one-part, solvent-free, non-self fluxing underfill directly to the active side of a wafer in a coating thickness typically of about 0.003 in. to 0.070 in. (0.076-1.77 mm). The underfill is initially a liquid coating that partially or completely covers the wafer solder bumps. The underfill comprises a filled, 100% solids (essentially non-volatile) liquid coating. The underfill is solidified on the wafer to a solid, heat-liquefiable state by exposure of from about 50 to 2400 mJ/cm$^2$ of actinic radiation. The underfill can be applied in a grid pattern outside the wafer saw streets, or is a continuous coating can be formed that can undergo dicing of the wafer into singulated sections or dies. The coated wafer or coated singulated sections are capable of ambient storage for an indefinite delay period, on the order of months prior to assembly and solder interconnection. In an assembled chip, which employs application of a surrounding encapsulant applied around the wafer-applied underfill, the thermal cure onset of the solid, heat-liquefiable underfill can be 150° C. or higher. In embodiment underfills, which heat-liquefy and flow out to the edge of the wafer, and to some extent flow upwards to form a fillet, the thermal cure activation temperature of the underfill must be greater than 170° C. The heat applied to reflow the solder is sufficient to activate the melt-flow of the underfill prior to activating the thermal cure system, which causes gelation of the underfill to a solid, thermoset state. In the thermoset cured state the underfill exhibits a flexural modulus of less than 10 Gpa.

The one-part liquid underfill comprises a mixture of one or more ethylenic unsaturated monomers as the photocurable component, one or more epoxy curable materials, one or more photoinitiators, latent thermal curative(s), a heat conductive, and an electrically insulating filler, and is characterized by a photocurable component representing from 5% to 30% of the total underfill weight and an epoxy resin component representing from 10% to 45% of the total underfill weight. A preferred photocurable component comprises 100% of a monofunctional ethylenic unsaturated acrylate or methacrylate monomer. A preferred photopolymerizable component is a monofunctional cyclic ether and/or cyclic acetal of acrylic acid.

DETAILED DESCRIPTION OF THE PREFERRED EMBODIMENTS

Figure 1:
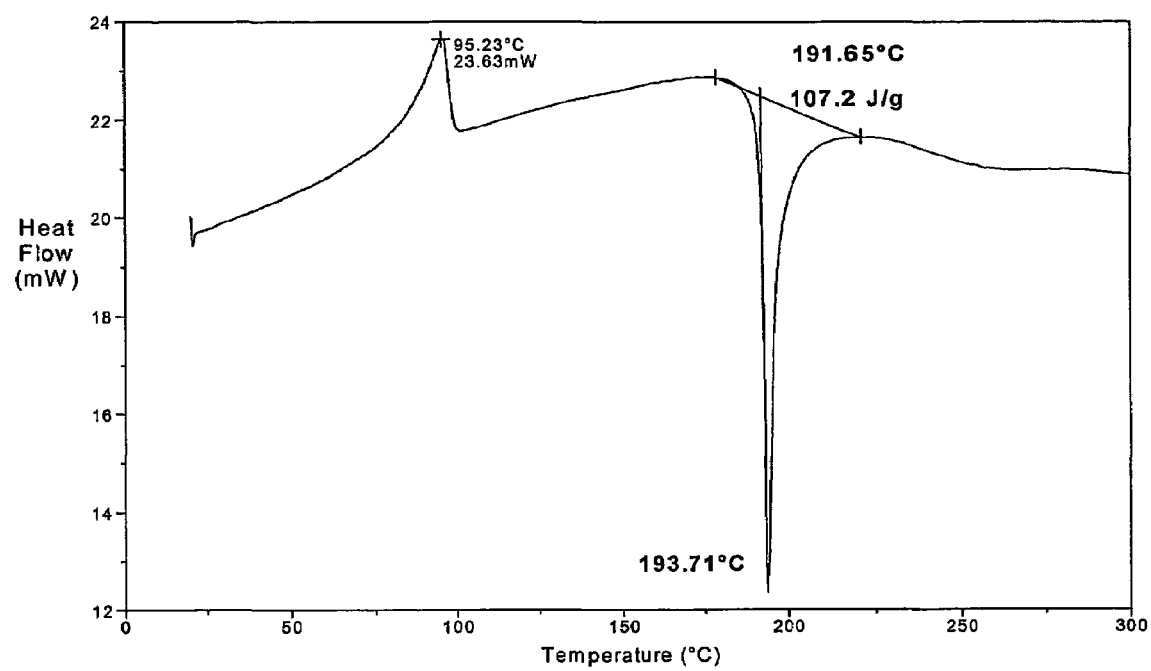
FIG. 1 represents a DSC curve for Example 6 showing a melting point, thermal cure onset, and peak temperature of reaction.

In the method aspect, the underfill according to the invention is adapted for conventional coating techniques to the active side of the wafer such as by spin casting, stenciling, printing, and the like. The rheology of the liquid underfill material is readily adaptable for the selected coating application method. The liquid underfill is applied to the bump or active side of a large wafer supported on a substrate, and subjected to photo-induced radical polymerization and rapidly forms a solid, self-supporting layer remaining adhered to the wafer. Photocuring solidification yields a tack-free solid underfill surface, without distortion of the wafer. The ambient solid-state underfill coating remains in a heat-liquefiable state for prolonged ambient storage periods, withstanding exposures at 50° C. for months also without imparting stresses to the wafer.

The delay period in which the photo-cured, heat-liquefiable solid underfill-coated wafer or singulated section is stored before solder interconnections are made is indefinite, on the order of weeks, months and up to a year or so. The storage conditions during the delay can include exposure of the underfill to ambient temperatures without refrigeration. The wafer applied under fill is distinguished from conventional thermoplastic, or thermoset materials cast from solvent, or melt processed using heat, and/or vacuum. Whereas according to the present invention the underfill is a 100% solids material that undergoes photo-induced solidification via addition polymerization on the wafer active side, and remains in a thermoplastic state with no cure advancement at ambient temperature over a significant delay in time until a second thermally initiated cure occurs, and the thermoplastic underfill has certain critical properties including non-delamination, absence of void formation, and sufficient reflow under solder reflow conditions, as well as long term adhesion under repeated thermal cycling conditions in the thermoset state without device failure or breakage. The thermoset cured underfill exhibits a range of flexural modulus of from 1000 to 5000 MPa at 25° C., and a coefficient of thermal expansion (CTE) below the glass transition temperature in the range of 15 to about 60 ppm/° C., more typically around 25 (+/−10) ppm/° C.

The wafer-level underfill comprises a 100% solids mixture. Volatile ingredients like solvents which contribute to weight loss during extended ambient storage are absent. The absence of volatile ingredients avoids solvent removal steps and improves shrinkage control and delamination of the photo-induced solidified coating from the surface of the active side of the wafer. Elimination of volatile organic components prevents unacceptable shrinkage and stress, and off-gassing during the solder reflow step, preventing voids from forming between the wafer or section and the PCB. The underfill is non-self fluxing. In other words, the components employed do not provide a fluxing function and are non-acidic.

In a general method aspect, the invention includes applying a liquid underfill adhesive to a integrated circuit wafer, application of a controlled dosage of photonic energy (ultraviolet, visible, infrared, etc.), solidification of the underfill to heat-liquefiable or melt-flowable state, optionally singluating the wafer by dicing or sawing, and storage of the coated wafer or dice during the delay period. After a delay period, electrical connection is made and the applied photo-cured solid underfill heat-liquefies and flows to the edges of the device during solder reflow and undergoes a cure transition from a heated liquid to a thermoset solid state. During the intervening delay time of storage, the coatings of the present invention remain in the liquefiable solid state and do not advance in gel content. Therefore in one aspect there is provided an ambient temperature stable integrated circuit wafer having an active side adhered to an underfill composition that comprises a photo-cured, one-part composition comprising on a weight basis:

a photocurable acrylate component,
a polyfunctional epoxy resin,
at least one photoinitiator,
a non-electrically conductive filler, and
non-fluxing heat activated epoxy curative, wherein the said
    underfill in the thermoset state exhibits a flexural modulus of from 1000 to 5000 MPa at 25° C.,
and a coefficient of thermal expansion below the glass transition temperature of said underfill composition of from 15 to 50 ppm/° C.

In another aspect, the invention is directed to the two-stage method for curing a wafer-applied underfill composition. The method comprises applying the underfill composition in a liquid form to an active side of a semiconductor wafer. Application methods include spin casting, printing or stenciling the liquid, non-volatile (100% solids) coating directly on the active side of the chip. The coated wafer is solidified via UV radiation in a chosen dosage for form a solid coating. The solid coated wafer can optional be diced into sections. The wafer or sections are capable of ambient temperature storage, followed by the secondstage of making electrical connections of the solder bumps to a PCB in a solder reflow step, followed by thermal curing of the solid underfill to a thermoset state.

The 100% solids underfill composition essentially includes a photocurable acrylate component comprising a monofunctional ethylenic unsaturated monomer and/or oligomers, polyfunctional epoxy resin, photoinitiator, latent epoxy thermal initiator, and an inorganic CTE-reducing filler. The underfills are not alkali-soluble in the solid state, and contain no acidic groups in the liquid photocurable unsaturated monomers, -oligomers and/or polymers, such as free carboxylic, phosphate, or sulfonate groups. The weight percent of the components utilized in the wafer composition are combined to total 100% by weight and are as follows:

| Component | Weight % |
| --- | --- |
| photocurable acrylate component | 5-30% |
| liquid polyfunctional epoxy resin | 10-45% |
| photoinitiator | 0.3-3% |
| low CTE filler | 40-70% |
| latent cure accelerator | 1-3% |

The underfill composition in the solid, heat-liquefiable state, prior to converting to the thermoset state is self-supporting, shelf-stable, and maintains adhesion to the active side of the wafer or section for long delay periods at ambient temperature, enabling decoupling of underfill application and solder-reflow chip installation steps. The invention enables storage of the wafer at ambient conditions for later installation on a PCB.

The photocurable component of the underfill composition comprises ethylenic unsaturated monomer or mixture of monomers having at least 6 carbon atoms in their structure. Incorporation of monomers with fewer than 6 carbon atoms result in problems in photocuring to a solid state from unacceptable volatility, and shrinkage in conversion to the photocured heat-liquefiable, solid state that tends to add stresses to the chip which is adhered thereto. An underfill containing more than 10 wt. % of liquid multifunctional ethylenic unsaturated co-monomers on total weight of the photocuring components leads to insufficient melt-flow of the heat-liquefiable underfill during the solder-reflow steps during chip installation. It is a preferred aspect therefore that polyunsaturated monomers are absent in the underfill, or limited to not more than 10 wt. % of the weight of the underfill photocurable component.

The term photocurable component collectively refers to ethylenic unsaturated monomers and/or oligomers however employed. More preferred are ethylenic unsaturated materials include vinyl esters, vinyl ethers, and/or $\alpha,\beta$-unsaturated acrylate esters. The preferred photocurable components are ethylenic unsaturated acrylates as monomers, unsaturated oligomers, or pendant unsaturated oligomers, and combinations thereof. The term oligomer means unsaturated compounds in the liquid state at 25° C., or capable of being dissolved in a photocurable liquid carrier. Non-functional or saturated thermoplastic polymer diluents can be employed, e.g., polyacrylates, polyvinylethers, polyvinylesters, polyesters, polyamides, polyolefin, and functionalized derivatives, and the like, provided the softening temperature of the diluent does not significantly retard the melt-flow of the heat liquefiable underfill at solder-reflow temperatures. Such diluents can be employed for various features, such as precisely controlling, or enhancing melt flow properties and/or cohesive strength.

When the wafer applied underfill containing the photocurable acrylate component polymerizes under the influence of UV radiation, the underfill is converted from a liquid at ambient temperatures to a solid state. The solid remains as a thermoplastic, meaning, it remains in a heat-liquefiable state until thermally cured. The specified amount of photocurable component is from 5-30 wt % of the total underfill weight. The amount of polyfunctional epoxy material is critical relative to the weight of photocurable component to provide adequate solidification upon photo-curing, and retain melt-flowability during the solder reflow step. Above a range of 10-45 wt. % of polyfunctional epoxy material, there is also an increased tendency of the underfill to damage the wafer after photocuring. Below this range there is insufficient cohesive strength in the heat-liquefiable solid, and increased creep during ambient temperature storage, prior to solder-reflow. The crossectional thickness of the underfill coating on the active side is most preferably of a dimension that a portion of the solder bumps are exposed. By exposure is meant that metal is exposed to the air, or there may be a thin residue of the underfill of less than about 0.01 µm over the outermost protruding areas of the solder bumps. IN a preferred embodiment the thickness of the underfill coating after photo-curing is from 50-90% of the profile of the solder bumps. The profile is the depth of the solder bump portion that extends beyond the surface plane of the wafer active side.

Photocurable oligomers optionally employed herein are liquids at ambient temperatures or solids capable of being dissolved in a liquid ethylenic unsaturated acrylate monomer. Oligomers contain one or more pendant or terminal ethylenic unsaturated groups. A typical oligomer contains two terminal unsaturated groups. The average number of unsaturated groups in an oligomeric photocurable acrylate component having a MW from 500-3000, can be from 1 to 2. The photocurable acrylate component excludes solely a di-, or tri- or tetra- and higher ethylenic unsaturated monomers, dimers or trimers.

Underfill embodiments of the invention exhibit melt flow under solder reflow conditions sufficient to flow outward toward the chip edge and completely fill the gap between the chip underside and PCB. In some instances, flow out can include flow up along the die edge to form a fillet. The photocured solid underfill adheres well to the wafer and has sufficient cohesive strength necessary for long-term storage and/or dicing yet does not warp or break the wafer. After the storage delay period, the heat-liquefiable sold will flow sufficiently under heat encountered in the solder reflow step when the weight ratio of photocurable acrylate component to epoxy functional component is in a range of from 1:10 to 1:2, and the photo-cured component contains the specified proportions of mono-functional and multi-functional monomers and/or oligomers. In a ratio of less than 1:10, photo-curable component to epoxy functional component, the underfill typically lacks sufficient cohesive strength and/or exhibits unacceptable surface tack. In a ratio above 1:2, the wafer exhibits warping, breaking and/or the underfill tends to delaminate, or undergoes insufficient flow for fillet formation.

Exemplary mono-ethylenically unsaturated monomers usable herein are those having at least 6 carbon atoms, and include alkyl $C_3$-$C_{12}$ alkyl esters of acrylic or $C_1$-$C_4$ alkyl-substituted acrylic acids, collectively (alk)acrylates. Specific examples of suitable monofunctional monomers include butylacrylate, ethylmethacrylate, butylmethacrylate, t-butyl methacrylate, cyclohexyl methacrylate, trimethylcyclohexylmethacrylate, cyclic ether acrylates, and monocyclic acetal acrylate. Monocyclic acetal acrylates are known and disclosed in U.S. Pat. No. 4,076,727. The acetal acrylates are derived from polyols such as trimethylolpropane, trimethylolethane, glycerin, 1,2,4-butanetriol, 1,2,5-pentanetriol, and 1,2,6-hexanetriol, in a reaction with an aldehyde, and transesterification with an $\alpha,\beta$-unsaturated carboxylate, such as acrylic acid, or ester. An exemplary photocurable component is a combination of a cyclic ether-containing acrylate, such as tetrahydrofurfurylacrylate (THFA), and a cyclic alkylol formal acrylate. Preferred monofunctional acrylates are tetrahydrofurfuryl acrylate, tetrahydrofurfuryl methacrylate, pentaerythritol monomethacrylate, pentaerythritol monoacrylate, trimethylolpropane monomethacrylate, trimethylolpropane monoacrylate and cyclic alkylol formal acrylates, and ketal acrylates. The acetal and ketal acrylates may include isomer mixtures. Cyclic alkylol formal and ketal acrylates are readily prepared by esterifying an acrylate or methacrylate monomer with mono hydroxy acetals derived from triols, such as trimethylolpropane and triethylolpropane. The structures of suitable triol starting materials which can be reacted with an aldehyde or ketone, and acylated using acrylates of methacrylates include the following: following.

The cyclic alkylol formal acrylates which are preferred have the following structures (A-C)

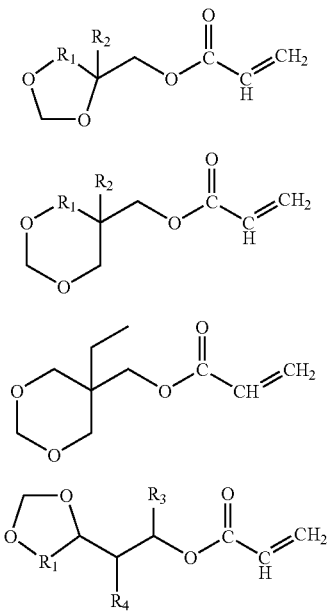

wherein $R_1$, is $C_1$-$C_4$ alkylene group e.g., —$CH_2$—, —$CH_2CH_2$—, etc. and $R_2$, $R_3$, and $R_4$ are H or $C_1$-$C_4$ alkyl groups, e.g., —$CH_3$, —$CH_2CH_3$, etc.

The most preferred cyclic alkylol formal acrylate is trimethylolpropaneformalacrylate (structure B').

Other photocurable monomers used alone or in combination with any of the foregoing monomers include, acetoacetoxyethyl methacrylate, 2-acetoacetoxyethyl acrylate, 2-acetoacetoxypropyl methacrylate, 2-acetoacetoxypropyl acrylate, 2-acetoacetamidoethyl methacrylate, 2-acetoacetamidoethyl acrylate, 2-cyanoacetoxyethyl methacrylate, 2-cyanoacetoxyethyl acrylate, N-(2-cyanoacetoxyethyl)acrylamide, 2-propionylacetoxyethyl acrylate, N-(2-propionylacetoxyethyl)methacrylamide, N-4-(acetoacetoxybenzyl)phenylacrylamide, ethylacryloyl acetate, acryloylmethyl acetate, N-ethacryloyloxymethylacetoacetamide, ethylmethacryloyl acetoacetate, N-allylcyanoacetamide, methylacryloyl acetoacetate, N-(2-methacryloyloxymethyl)cyanoacetamide, ethyl-α-acetoacetoxy methacrylate, N-butyl-N-acryloyloxyethylacetoacetamide, monoacrylated polyols, and reaction product of hydroxyl-group containing acrylate and an anhydride, such as monomethacryloyloxyethyl phthalate. Copolymerizable monomers that are copolymerizable with the (alk)acrylate monomers, provided the polymerization rate is not slowed to a significant degree compared to acrylate monomers.

The rapid photocuring of acrylic monomers is a desired feature. Photocurable ethylenically unsaturated monomers other than acrylates and alkacrylates, are limited to about 6 carbons and higher, examples of which include but are not limited to butylvinylether, isobutylvinylether, cyclohexyl vinyl ether p-(2-acetoacetyl)ethylstyrene, and 4-acetoacetyl-1-methacryloylpiperazine. Ethylenic unsaturated monomers containing epoxy-reactive groups, e.g., active hydrogen-containing groups are not employed in the photocurable component.

Representative of known multifunctional ethylenic unsaturated compounds are the ethylenically di-unsaturated monomers such as ethylene glycol diacrylate, polyethylene glycol diacrylate, ethylene glycol dimethacrylate, hexanediol diacrylate, and triethylene glycol diacrylate. Representative tri-unsaturated monomers include trimethylolpropane triacrylate (TMPTA), trimethylolpropane trimethacrylate, glycerol triacrylate, pentaerthyitol triacrylate, and pentaerythritol trimethacrylate. Representative acrylic unsaturated photocurable materials are SR205, SR306, CD401, SR508, SR603, SR9036 from Sartomer, Exton, Pa.

Other suitable photopolymerizable oligomer materials are includable in the photocurable component, among these, are, for example, bis-phenol-based polyether acrylates, vinyl ether capped oligomers, reaction products of hydroxy functional acrylates and methacrylates and epoxides, acrylated polyethers, ethylenically unsaturated polyalkylethers, the aforementioned cyclic ether acrylates and cyclic ether acetal acrylates.

A photopolymerizable component can be a mixture of a mono-unsaturated acrylate monomer and ethylenically unsaturated oligomer having a number average molecular weight of from 500-5,000, and preferably from 1,000 to 4,000. A photocurable liquid oligomer can comprise a urethane acrylate oligomer having no active isocyanate groups. Urethane acrylate oligomer can also be combined with the ethylenic unsaturated acrylate monomer. Acrylated urethanes can be aliphatic or aromatic. Examples of commercially available acrylated urethanes include those known by the trade designations PHOTOMER (e.g., PHOTOMER 6010) from Henkel Corp. Hoboken, N.J.; EBECRYL 220 (hexafunctional aromatic urethane acrylate of molecular weight 1000), EBECRYL 284 (aliphatic urethane diacrylate of 1200 molecular weight diluted with 1,6-hexanediol diacrylate), EBECRYL 4827 (aromatic urethane diacrylate of 1600 molecular weight), EBECRYL 4830 (aliphatic urethane diacrylate of 1200 molecular weigh diluted with tetraethylene glycol diacrylate), EBECRYL 6602 (trifunctional aromatic urethane acrylate of 1300 molecular weight diluted with trimethylolpropane ethoxy triacrylate), and EBECRYL 840 (aliphayic urethane diacrylate of 1000 molecular weight) from UCB Radcure Inc. Smyrna, Ga.; SARTOMER (e.g., SARTOMER 9635, 9645, 9655, 963-B80, 966-A80, etc.) from Sartomer Co., Exton, Pa., and UVITHANE (e.g., UVITHANE 782) from Morton International, Chicago, Ill.

Includable with the photocurable acrylate components optionally are acrylate-modified epoxy materials having one or more than one photocurable unsaturated acryiate group, such as the diacrylate esters of bisphenol A epoxy resin, although such mixtures are not preferred. A representative acrylate-modified epoxy is obtained by reaction of hydroxyl groups on an acrylate with oxirane groups. No unreacted epoxy curable function remains. Examples of commercially available acrylated epoxies include those under the CMD designation from Radcure Specialties. Other suitable acrylic unsaturated epoxy oligomers or urethane acrylate oligomers are available commercially, such as CN929, CN136, CN970, CN104, CN120C60, from Sartomer. Proprietary acrylate modified epoxy liquids may be formulated with additional mono- or multifunctional acrylates. The amount of any additional mono- or multifunctional acrylate monomer is included in the total compositional range in the photocuring component.

Representative diacrylate functional photocurable materials include SR205, SR306, CD401, SR508, SR603, SR9036.

Representative tri-functional materials include SR350, SR444, CD501, SR9021. Tetra-functional acrylates include SR295, SR355, SR399, SR9041.

The thermosetting polyfunctional epoxy resin component of the underfill contains at least one liquid resin that contains at least two epoxy groups, a viscosity of less than about 10,000 poises at 25° C., an average weight per epoxide (WPE) in the range of about 100 to about 1000 and an average molecular weight within the range of about 500 to about 3500. Readily usable epoxies are known and include a diglycidal ether of bisphenol A, 2,2-bis4-(2,3-epoxypropoxy)-phenyl)propane. Commercially available suitable epoxides compounds are sold under the trade designation EPON 828, EPON 1004 and EPON 1001 F available from Shell Chemical Co., and DER-331, DER-332 and DER-334 available from Dow Chemical Co. Other suitable epoxy resins include cycloaliphatic epoxies, glycidyl ethers of phenol formaldehyde novolac (e.g., DEN-431 and DEN-428 available from Dow Chemical Co. The blend of free radical curable resins and epoxy resins are further described in U.S. Pat. No. 4,751,138 (Tumey et al.) and U.S. Pat. No. 5,256,170 (Harmer et al.). In a preferred embodiment, a combination of three epoxy resins is employed which is a mixture of a biphenyl epoxy resin with a WPE of about 192 g/eq., a diglycidal ether of bisphenol F having a WPE of about 172 g/eq., and a triglycidal ether of p-aminophenol having an WPE of about 101 g/eq. These three epoxy resins are available under the RSS, EPICLON, and ARALDITE trade designations, respectively The liquid wafer coating contains from about 1 to 3 wt. % of at least one photoinitiator effective to solidify the liquid underfill to a tack-free surface upon exposure to conventional levels of actinic radiation. The photoinitiator type selected depends on the desired depth of cure, the type of contrast agent used and on the wavelength of the radiation preferably employed. Commercially available free-radical generating photoinitiators suitable for use herein include, but are not limited to benzophenone, benzoin ether and acylphosphine oxide-type photoinitiators such as those sold under the trade designations IRGACURE® and DAROCUR® from Ciba Specialty Chemicals, Basel, Switzerland.

A photoinitiator system which is preferred is a mixture of 25% to 50% of a ketone-functional photoinitiator and from 50% to 75% of a monoacylphosphine, bisacylphosphine oxide, or phosphinate-containing photoinitiator. Example ketone photoinitiators include 1-hydroxycyclohexylphenylketone, hydroxymethylphenylpropanone, dimethoxyphenylacetophenone, 2-methyl-1-[4-(methyl thio)-phenyl]-2-morpholinopropanone-1,1-(4-isopropylphenyl)-2-hydroxy-2-methylpropan-1-one, 1-(4-dodecyl-phenyl-2-hydroxy-2-methylpropan-1-one, 4-(2-hydroxyethoxy)phenyl-2(2-hydroxy-2-propyl)-ketone, diethoxyphenyl acetophenone, 2,4,6 trimethylbenzoyl diphenylphosphone, 2-hydroxy-2-methyl-1-phenyl propan-1-one, 1-[4-(2-hydroxyethoxy)phenyl]-2-hydroxy-2-methylpropan-1-one, and 2-hydroxythioxanthen-9-one. Representative acyl phophine oxide photoinitiators include ethyl 2,4,6-trimethylbenzoyldiphenylphosphine oxide, 2,4,6-triethyl benzoyl diphenyl phosphine oxide, and 2,4,6-triphenyl benzoyl diphenyl phosphine oxide. A specific example photoinitiator component for deep curing of the liquid underfill applied on the wafer is a mixture containing 0.2-0.5 wt. % on total weight of the underfill of 1-hydroxycyclohexylphenyl ketone, and 0.5-0.7 wt. % on total weight of the underfill of phenyl bis(2,4,6-trimethylbenzoyl) phosphine oxide.

Any source of actinic light dose that does not raise the coating temperature above 120° C. can be used in carrying out the photocuring solidification of the underfill to the solid liquefiable gel state. Ultraviolet light is most readily employed, as well as other forms, such as Type RS Sunlamps, carbon arc lamps, xenon arc lamps, mercury vapor lamps, tungsten halide lamps and the like. The radiation energy may emanate from a point source or in the form of parallel rays. Divergent beams, are however, also operable as a source of actinic light. A UV dosage in a range of 100 to 2400 mJ/cm$^2$ is effective to provide a depth of underfill cure of from about 1.2-1.8 mm and complete the radical polymerization at an underfill temperature below 100 ° C. The underfill compositions photocure to a tack-free surface. Curing periods may be adjusted to proper choice of ultraviolet source, underfill photocuring component concentration, and contrasting agent.

In package assemble, automatic visual checking of products necessitates the use of a pigment for providing contrast between the board, the underfill and the chip. Contrasting agent, such as carbon black, and pigments such as available under the Sandorin® mark of Clariant AG, are suitable. In one embodiment, a 15 wt. % dispersion of carbon black in epoxy resin is used to incorporate from 0.1-0.2 wt % carbon black in the underfill to provide effective contrast for automated visual checking.

Thermal Cure System

The epoxy curing system utilized in the present invention is a non-fluxing type comprising latent thermal accelerator(s) having a temperature of onset of curing of greater than 150 ° C., preferably greater than 160° C.±5° C., and more preferably 175° C.±5° C., and higher. The solidified, aged underfill is adapted using the latent thermal curing agent for the epoxy resin to initiate cure to a thermoset stage at the temperatures encountered just after solder reflow occurs. Dicyandiamide can not be used alone as the thermal curing agent, but may be used in minor amount in conjunction with an latent thermal accelerator, but is preferably absent. The preferred latent thermal curing agents include amines, and amine-adducts; these include imidazoles and urea derivatives, e.g., 2,4,6-trimethyl-1,3-bis(3,3-dimethylureido)benzene and 1,5-bis(3,3-dimethylureido)naphthalene. The thermal curing agent must be non-halogenated. An example curing agent is obtainable in the known manner of mixing (a) an epoxy compound or isocyanate compound and an amine compound, or by mixing an epoxy compound or isocyanate compound, an amine compound and an active hydrogen compound, as is taught in U.S. Pat. No. 5,543,486. Verious blocked amines are suitable. A preferred thermal curing agent is a blocked amine with tertiary amine and urea moieties. Exemplary imidazoles suitable for the thermal curing component are 2-methylimidazole; 2-ethylimidazole; 2-ethyl-4-methylimidazole; 2-phenylimidazole; 2-phenyl-4-methylimidazole; 2-undecenylimidazole; 1-vinyl-2-methylimidazole; 2-n-heptadecylimidazole; 2-undecylimidazole; 2-heptadecylimidazole; 2-ethyl 4-methylimidazole; 1-benzyl-2-methylimidazole; 1-propyl-2-methylimidazole; 1-cyanoethyl-2-methylimidazole; 1-cyanoethyl-2-ethyl-4-methylimidazole; 1-cyanoethyl-2-undecylimidazole; 1-cyanoethyl-2-phenylimidazole; 1-guanaminoethyl-2-methylimidazole; 2-(p-dimethylaminophenyl-4,5-diphenylimidazole; 2-(2-hydroxyphenyl)-4,5-diphenylimidazole; 2-phenyl-4-hydroxymethylimidazole; 2-phenyl-4,5-di(hydroxymethyl)-imidazole; di(4,5-diphenyl-2-imidazole)-benzene-1,4,2-napnthyl-4,5-diphenylimidazole; addition products of an imidazole and trimellitic acid; addition products of an imidazole and 2-n-heptadecyl-4-methylimidazole; phenylimidazole; benzylimidazole; 1-(dodecyl benzyl)-2-methylimidazole; 2-(2-hydroxyl-4-t-butylphenyl)-4,5-diphenylimidazole; 2-(2-methoxyphenyl)-4,5-diphenylimidazole, 2-methyl-4,5-diphenylimidazole, 2,3,5- triphenylimidazole; 2-styrylimidazole; 2-(3-hydroxyphenyl)-4-,5-dipheny limidazole; 1-benzyl-2-methylimidazole; and 2-p-methoxystyrylimidazole. A preferred thermal cure agent is available from Air Products and Chemicals under the Curezol® 2-PHZ-S designation.

Alternative thermal cure agent can comprise blocked Lewis acids, e.g., latent metal acetoacetate-functional curatives can be used such as aluminum chelates include ethyl acetoacetate metal diisopropylate, metal tris(ethyl acetoacetate), alkyl acetoacetate metal diisopropylate, aluminum monocetyl acetonate bis(ethyl acetoacetate), aluminum tris(acetyl acetonate); and examples of cyclic aluminum oligomers include cyclic aluminum oxide isopropylate.

In order to provide adequate reflow of the photo-cured liquefiable solid, no advancement of the thermal cure system in the photo-cured solid coating on the wafer or dice takes place during the storage delay period. The thermal cure onset minimum temperature is predetermined by the selection of the thermal curing agents employed, and occur after the onset of solder reflow, at a temperature greater than or equal to 150° C. Preferably, the minimum underfill thermal cure onset is in the range of 150° C. to 225° C. The temperature of onset of thermal curing and peak cure rate is readily determined by differential scanning calorimetry, and known in the art. Temperatures of onset of thermal curing depend upon the choice and amount of accelerator and should not be more than about 280° C. The onset of thermal cure should not be too near the peak temperature which is typically at or near 250° C. for eutectic solder and 300° C. for lead free solder. A typical solder reflow time takes 3 to 4 minutes, and the underfill is typically exposed to the peak temperature for less than 30 seconds. Thermal cure initiated at temperatures below 150° C. leads to inadequate underfill liquefaction and flow.

A non-conductive filler is employed to limit the CTE in the underfill. These fillers are known and various types are suitable. There are available microelectronic grades of fused silica, crystalline silica, nitrides of boron, aluminum and silicon, magnesia, magnesium silicate and silica-coated aluminum selectable based on desired attributes and cost. Viscosity-build in the liquid underfill is a selection criteria. Due to the absence of solvents or non-reactive diluents, underfill embodiments according to the invention can be readily adapted for methods utilizing relatively low viscosity coatings, such as known spin-coating methods. Spin-castable underfill embodiments according to the invention exhibit a conventional viscosity which is relatively lower than the typical viscosity employed for underfills applied by stenciling or printing.

In a preferred embodiment the underfill is applied by stencil printing in a pattern that covers at least 70% of each wafer area between the saw streets. The CTE of the underfill in the thermoset state is in a range of from 15 to 50 ppm/° C. and requires a non-conductive filler level, preferably spherical fused silica particles employed in a range amount of from 40 wt. % to 70 wt. %, preferably 45 to 60 wt. %. More preferably, the inorganic, low CTE filler is used in amount from 45 to 55 wt. %. The preferred low CTE inorganic filler has an average particle size of at least 10 µm and an average size of not larger than about 75 µm. The upper range of filler diameter employed should be less than the thickness of the underfill coating, noted above.

Optionally, the underfill can contain an adhesion improver. A typical useful amount is 3 to 8 wt. %. Adhesion improvers are known and include organosilanes, organopolysiloxanes, organohydrogenpolysiloxanes, prehydrolyzed organosilanes, siloxanes, and silsequioxanes. Exemplary organosilanes contain epoxy functional groups, such as mono(epoxy-hydrocarbyl)trialkoxysilanes like γ-glycidoxypropyltrimethoxysilane, γ-glycidoxypropylmethyldiethoxysilane and β-(3,4-epoxycyclohexyl)ethyltrimethoxysilane; or ethylenic unsaturated groups are preferred. The ethylenic unsaturated organosilicon compounds include mono- or multi-alkenyl functional organosilanes, such as 3-(meth)acryloxypropyl trimethoxy silane, vinyltriethyoxy silane, allyltrimethoxy silane as well as multi-alkenyl-functional siloxanes, for instance the hydrosilylation of 1,1,3,3-tetramethyidisiloxane and 1,2,4-trivinylcyclohexane and/or 1,3,5-trivinylcyclohexane.

One method of applying the underfill to the wafer entails known screen printing techniques. Wafer underfills according to the invention can advantageously be printed on a wafer in a pattern registered to coover an area of the wafer surface outside of the saw streets. Preferably, the underfill which is applied by printing methods contains optional rheological control agent. A suitable known type is amorphous fumed silica, or silylated amorphous fumed silica, such as available from Cabot Corporation.

Flow modifiers which are known can optionally be employed. Thermoplastic flow modifiers increase the tendency to of the heat-liquefiable underfill to flow out during solder reflow. Representative flow improvers include polymethacrylate copolymers of I.V. typically from about 0.2 to 0.6, such as available under the Elvacite® mark. An example is Elvacite® 2013, and is believed to be a 64% butylmethacrylate/36% methylmethacrylate copolymer having an I.V. of 0.2, ex ICI Acrylics. Other flow modifiers known in the art include Lanco® Flow P10, ex. Lubrizol, Wickliffe, Ohio, U.S.A. and MODAFLOW® Powder available from Solutia, St. Louis, Mo. Flow improvers can be based on SAN, or α-olefin polymers, and the like. A preferred flow improver is a thermoplastic PMMA copolymer has a molecular weight of 60,000 MW, such as Elvacite® 4026, from INEOS Acrylics, Inc. A suggested amount of optional thermoplastic flow improver as a wt. percent of the photocurable component is from 1.0 to 10.0 wt. %. Contemplated within the purvue of modifying the flowability of the underfill in the photo-cured, heat-liquefiable state, a minor amount, less than 10 wt. % of a plasticizer, such as a carboxyester, or lubricant such as ethylene bis-stearamide can be used.

Testing Methods

1. Glass Transition Temperature (Tg)

Using a sample of b-staged or thermoset-cured material, the glass transition temperature was measured with a thermomechanical analyzer at a heating rate of 5° C./min, a dynamic mechanical analyzer at a heating rate of 5° C./min, and or a differential scanning calorimeter at a heating rate of 5° C./min.

2. Coefficient of Thermal Expansion

In the measurement of the coefficient of thermal expansion above and below the Tg is determined by use of a conventional thermomechanical analyzer.

3. Viscosity

A Brookfield VDIII+ cone and plate rheometer is suitable, however a Haake® RheoStress I was used.

4. Die shear adhesion is tested according to ASTM D1002.

5. Thermal and oxidative stability is measured by thermogravimentric analysis. The underfills exhibit less than 5% weight loss at 300° C. in air.

Polymerization Conditions

The following conditions using an AETEK UV processing unit adequately causes the liquid underfill to solidify through the depth of the coating.

| Lamp 1 (W) | Lamp 2 (W) | Belt Speed (fpm) | Cure Energy (mJ/cm$^2$) |
| --- | --- | --- | --- |
| 400 | 400 | 34 | 1170 |
| 200 | 200 | 30 | 761 |
| 200 | 200 | 45 | 515 |
| 200 | 200 | 60 | 384 |
| 200 | 200 | 65 | 349 |
| 200 | 200 | 70 | 327 |
| 125 | 125 | 30 | 712 |
| 125 | 125 | 70 | 297 |
| 200 | 0 | 45 | 274 |
| 200 | 0 | 60 | 205 |
| 200 | 0 | 70 | 176 |
| 125 | 0 | 70 | 149 |
| 125 | 0 | 90 | 116 |

Working Embodiments

Underfill Examples 1-4 were prepared by adding the ingredients to Hauschild® cup and mixing for 30 sec. at 3000 rpm. The formulas were spin-coated onto a Umicore® Semiconductor wafer, 4 in. (10.1 cm) diameter×400 +/−μm thickness. The coated wafers were photo-cured with an Aetec UV oven at a setting of 200 W/200 W at 30 fpm, N$_2$ atm, and one pass. The film in the liquefiable gel state was tack free. Storage of the underfills in the photo-cured for 8 months did not result in further curing activity as confirmed by DSC. The thermal curing onset temperature was 150° C.±2° C., with a peak exotherm at 166° C.

EXAMPLE 1

| component | weight parts |
| --- | --- |
| 1. bisphenol A-epichlorohydrin-epoxy resin (residual epichlorohydrin <1 ppm) (RSL-1462, ex Shell Resins, Inc.(CAS #25068-38-6)) | 19.03 |
| 2. poly(acryl)unsaturated urethane acrylate oligomer (CN120C60, ex. Sartomer) | |
| 3. epoxy acrylate oligomer (CN136, ex Sartomer) | 18.50 |
| 4. epoxy curing agent 1 (Ancamine 2441, ex. Air Products & Chem) | 1.14 |
| 5. epoxy curing agent 2 (Dyhard ® 100s, ex. SKWCHem.) | 1.33 |
| 6 trifunctional acrylate (SR 351, ex. Sartomer) | 7.00 |
| 7. photoinitiators | |
| Irgacure 184 | 2.00 |
| Irgacure 819 | 1.00 |
| 8. fused silica (F5BLDX, ex Denka) | 50.00 |
| Total | 100.00 |

EXAMPLE 2

| Component | weight parts |
| --- | --- |
| 1. bisphenol A-epichlorohydrin-epoxy resin (residual epichlorohydrin <1 ppm) (RSL-1462, ex Shell Resins, Inc.(CAS #25068-38-6)) | 36.28 |
| 2. epoxy curing agent 1 (Ancamine 2441, ex. Air Products & Chem) | 2.18 |
| 3. epoxy curing agent 2 (Dyhard ® 100s, ex. SKWCHem.) | 2.54 |
| 4. trifunctional acrylate (SR 351, ex. Sartomer) | 6.00 |
| 5. photoinitiators | |
| Irgacure 184 | 1.50 |
| Irgacure 819 | 1.50 |
| 6. fused silica (F5BLDX, ex Denka) | 50.00 |
| Total | 100.00 |

EXAMPLE 3

| Component | weight parts |
| --- | --- |
| 1. bisphenol A-epichlorohydrin-epoxy resin (residual epichlorohydrin <1 ppm) (RSL-1462, ex Shell Resins, Inc.(CAS #25068-38-6)) | 36.29 |
| 2. latent amine accelerator (Ancamine 2441, ex. Air Products & Chem) | 2.18 |
| 3. dicyandiamide (Dyhard ® 100s, ex. SKWCHem.) | 2.54 |
| 4. trifunctional acrylate (SR 351, ex. Sartomer) | 6.00 |
| 5. photoinitiators | |
| Irgacure 184 | 2.00 |
| Irgacure 819 | 1.00 |
| 6. fused silica (F5BLDX, ex Denka) | 50.00 |
| Total | 100.01 |

EXAMPLE 4

| Component | weight parts |
| --- | --- |
| 1. bisphenol A-epichlorohydrin-epoxy resin (residual epichlorohydrin <1 ppm) | 18.15 |

-continued

| Component | weight parts |
|---|---|
| (RSL-1462, ex Shell Resins, Inc.(CAS #25068-38-6)) | |
| 2. acrylate modified epoxy oligomer | 19.50 |
| (CN 136, ex Sartomer) | |
| 3. latent amine accelerator | 2.18 |
| (Ancamine 2441, ex. Air Products & Chem) | |
| 4. dicyandiamide | 2.54 |
| (Dyhard ® 100s, ex. SKWCHem.) | |
| 5. trifunctional acrylate | 6.00 |
| (SR 351, ex. Sartomer) | |
| 6. photoinitiators | |
| Irgacure 184 | 1.50 |
| Irgacure 819 | 1.50 |
| 7. fused silica | 50.00 |
| (F5BLDX, ex Denka) | |
| Total | 101.37 |

Examples 5-7 were prepared and spin-coated onto a Umicore® Semiconductor wafer, having a 4 inch (10.1 cm) diameter×400 μm thickness. The coated wafers were photo-cured with an AETEC UV curing oven at a setting of 200 W/200 W at 30 fpm under $N_2$ atm, with one pass. The photo-cured films of Examples 5-7 in the solid heat-liquefiable state were tack-free.

EXAMPLE 5

In the preparation of Example 5, components 1.-4. were mixed together in a 40 gram Hauschild® cup then heated to 60° C. until the photoinitiators completely dissolved. The samples were then mixed for 30 sec. at 3000 rpm on a Hauschild® mixer. The remaining components were added individually with mixing between each addition. The silica was added in incremental portions with mixing.

| Component | Description | Weight parts |
|---|---|---|
| 1. CN136 | Amine modified, acrylated epoxy | 6.70 |
| 2. SR203 | THFMA | 12.40 |
| 3. Irgacure ® 184 | photoinitiator | 0.30 |
| 4. Irgacure ® 819 | photoinitiator | 0.50 |
| 5. RSL-1462 | diglycidylether of bis A epoxy | 14.35 |
| 6. RSS-1407 | biphenyl epoxy resin | 14.35 |
| 7. Curezol ® 2PHZ-S | imidazole latent curative | 1.43 |
| 8. Filler | fused silica | 49.99 |
| | Total | 100.02 |

The thermal cure onset temperature of Example 5 was 167° C.

| | Example 5 |
|---|---|
| Tg - UV-B-staged | 23.56° C. |
| Tg - Thermally cured | 106.25° C. |
| CTE - Below Tg | 40.37 ppm/° C. |
| CTE - Above Tg | 107.7/ppm/° C. |
| Storage Modulus (@ 25° C.) | 2,761 Mpa |
| Storage Modulus (@ 175° C.) | 0.025 Gpa |

EXAMPLE 6

Examples 6 was prepared by adding the ingredients, except 50% of the fused silica to a 40 gram Hauschild® cup and mixing for 30 sec. at 3000 rpm. The remaining portion of fused silica was then added with mixing for 30 sec. at 3000 rpm. The mixture was heated in an oven at 45° C. for 30 min. to dissolve the photoinitiators. The solution mixture was mixed again for 30 sec. at 3000 rpm.

| Raw Material | Description | Weight parts. |
|---|---|---|
| SR203 | THFMA | 19.10 |
| Irgacure ® 184 | photoinitiator | 0.30 |
| Irgacure ® 819 | photoinitiator | 0.50 |
| RSS-1407 | biphenyl epoxy resin | 28.66 |
| Curezol ® 2PHZ-S | imidazole latent curative | 1.43 |
| Filler | fused silica | 50.01 |
| | Total | 100.00 |

Reference is made to FIG. 1 which represents a DSC scan curve for Example 6. The conditions for differential scanning calorimetry were:

A DSC, ex. Perkin-Elmer, model DSC 7 was used. Heating ramp conditions were −20° C.-300° C. at 5° C./min All samples were tested in the photo-cured state. The scan shows a melting temperature of the solid epoxy resin at 95.23° C., a cure onset temperature of 191.65° C., and peak reaction temperature for thermal cure of 193.71° C.

EXAMPLE 7

Example 7 was prepared by adding the ingredients, except 50% of the fused silica to a 40 gram Hauschild® cup and mixing for 30 sec. at 3000 rpm. The remaining portion of fused silica was then added with mixing for 30 sec. at 3000 rpm. The mixture was heated in an oven at 45° C. for 30 min. to dissolve the photoinitiators. The solution mixture was mixed again for 30 sec. at 3000 rpm.

| Raw Material | Description | Weight parts. |
|---|---|---|
| SR285 | THFA | 19.05 |
| Irgacure 184 | Photoinitiator | 0.30 |
| Irgacure 819 | Photoinitiator | 0.50 |
| RSS-1407 | biphenyl epoxy resin | 28.71 |
| Curezol | imidazole | 1.44 |
| Filler | fused silica | 50.01 |
| Total % | | 100.00 |

Figure 2:
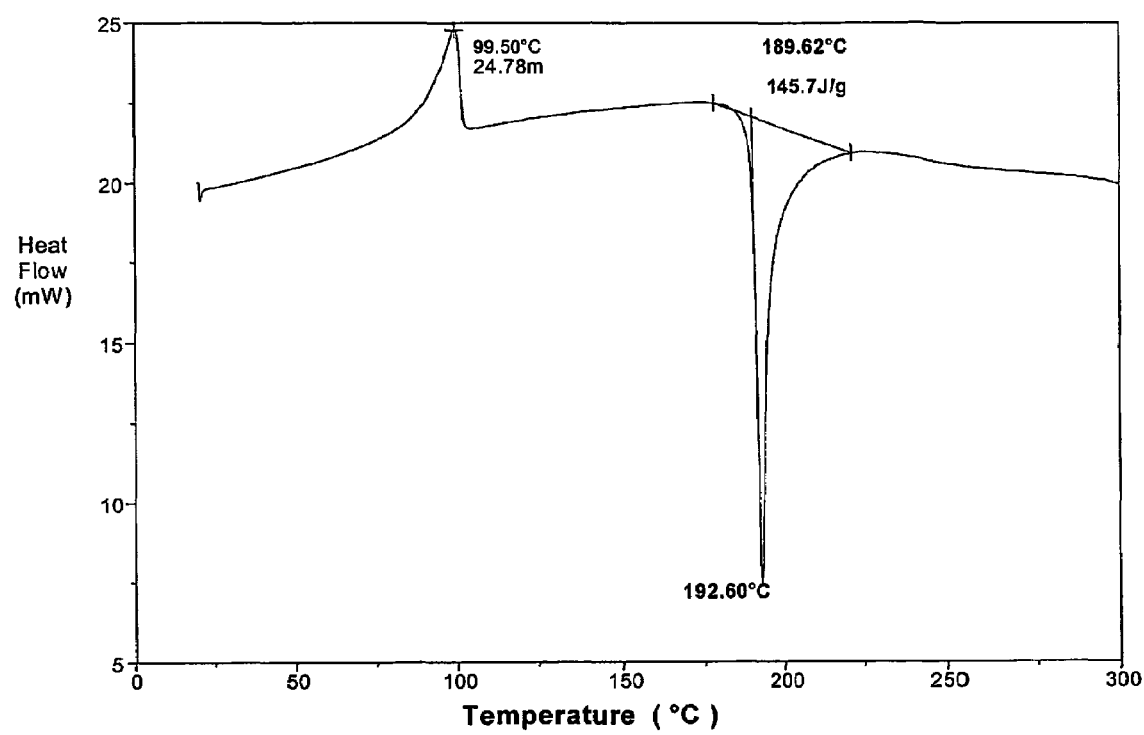
FIG. 2 represents a DSC curve for Example 7 showing a melting point, thermal cure onset, and peak temperature of reaction.

FIG. 2 below represents a DCS scan curve for Example 7. The conditions for differential scanning calorimetry were:

A DSC, ex. Perkin-Elmer, model DSC 7 was used. Heating ramp conditions were −20° C.-300° C. at 5° C./min All samples were tested in the photo-cured state. The scan shows a melting temperature of the solid epoxy resin at 99.5° C., a cure onset temperature of 189.62° C., and peak reaction temperature for thermal cure of 192.6° C.

EXAMPLE 8

Example 8 was prepared by adding the ingredients, except 50% of the fused silica to a 40 gram Hauschild® cup and mixing for 30 sec. at 3000 rpm. The remaining portion of fused silica was then added with mixing for 30 sec. at 3000 rpm. The mixture was heated in an oven at 45° C. for 30 min. to dissolve the photoinitiators. The solution mixture was mixed again for 30 sec. at 3000 rpm.

| Raw Material | Description | Weight parts |
|---|---|---|
| CN136 | Amine mod. acrylated epoxy | 6.70 |
| SR203 | THFMA | 12.40 |
| Irgacure ® 184 | Photoinitiator | 0.30 |
| Irgacure ® 819 | Photoinitiator | 0.50 |
| RSL-1462 | diglycidylether of bis A epoxy | 8.61 |
| RSS-1407 | biphenyl epoxy resin | 20.09 |
| Curezol ® | imidazole | 1.43 |
| Filler | FB5LDX (fused silica) | 49.99 |
| Total | | 100.02 |

| | Example 8 |
|---|---|
| Tg - photo B-staged WAU | 31.47° C. |
| Tg - Thermally cured | 116.44° C. |
| CTE - Below Tg | 40.56 ppm°/C. |
| CTE - Above Tg | 120.5 ppm/° C. |
| Storage Modulus (25° C.) | 3,313 MPa |
| Storage Modulus (175° C.) | 0.0268 Gpa |

COMPARATIVE EXAMPLE A (77-5)

| component | weight parts |
|---|---|
| 1. acrylate modified epoxy oligomer mixture with tri(acryl) functional monomer (CN120C60, ex Sartomer) | 43.00 |
| 2. tri(acryl) functional monomer (SR 351, ex. Sartomer) | 4.00 |
| 3. dicyandiamide (Dyhard ® 100s, ex. SKW CHem.) | 1.33 |
| 4. photoinitiators | |
| Irgacure ® 184 | 2.00 |
| Irgacure ® 819 | 1.00 |
| 5. fused silica (F5BLDX, ex Denka) | 50.00 |
| Total | 100.00 |

Comparative Example A, after photocuring, delaminated from the wafer after 24 hours ambient storage, and this was believed to be due to excessive shrinkage induced by photocuring.

COMPARATIVE EXAMPLE B

| component | weight |
|---|---|
| 1. bisphenol A-epichlorohydrin-epoxy resin (residual epichlorohydrin <1 ppm) (RSL-1462, ex Shell Resins, Inc.(CAS #25068-38-6)) | 18.15 |
| 2. acrylate modified epoxy oligomer mixture with tri(acryl) functional monomer (CN120C60, ex Sartomer) | 20.5 |
| 3. latent amine accelerator (Ancamine ® 2441, ex. Air Products & Chem) | 1.09 |
| 4. dicyandiamide (Dyhard ® 100s, ex. SKWCHem.) | 1.27 |
| 5. photoinitiators | |
| Irgacure 184 | 1.50 |
| Irgacure 819 | 1.00 |
| 6. fused silica (F5BLDX, ex Denka) | 50.00 |
| Total | 100.00 |

Comparative Example B also delaminated after 24 hours ambient storage.

The invention has found particular industrial utility as wafer applied underfills and methods for their preparation, the compositions of this invention may also be used for microelectronic applications beyond underfill, such as for glob top, direct chip attachment and other applications for thermosetting compositions. Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A liquid, 100% solids, non-self fluxing, one-part underfill composition, consisting essentially of:
from 5% to 30% by weight of a photocurable component containing no acidic groups, said photocurable component comprising one or more ethylenically mono-unsaturated monomers having at least 6 carbon atoms, oligomers thereof, or combinations thereof,
from 10% to 45% by weight of a polyfunctional epoxy resin,
from 0.3% to 3% by weight of at least one photoinitiator,
from 40%-70% by weight of a non-electrically conductive filler,
from 1%-3% by weight of a nonfluxing latent thermal accelerator,
said underfill in the thermoset state exhibiting a flexural modulus of from 1000 to 5000 MPa at 20° C., and a coefficient of thermal expansion below its glass transition temperature of from 15 to 50 ppm/° C.

2. The underfill composition according to claim 1 wherein said one or more ethylenically mono-unsaturated monomers are selected from the group consisting of vinyl esters, vinyl ethers, α,β-unsaturated acrylate esters, and mixtures thereof.

3. The underfill composition according to claim 1 wherein said one or more ethylenically mono-unsaturated monomers having at least 6 carbon atoms are acrylate monomers.

4. The underfill composition according to claim 3 wherein said acrylate monomers include at least one compound selected from the group consisting of $C_3$-$C_{12}$ alkyl esters of acrylic acid and $C_3$-$C_{12}$ alkyl esters of $C_1$-$C_4$ alkyl-substituted acrylic acid.

5. The underfill composition according to claim 1 wherein said one or more ethylenically mono-unsaturated monomers include at least one compound selected from the group consisting of butylacrylate, ethylmethacrylate, butylmethacrylate, t-butyl methacrylate, cyclohexyl methacrylate, trimethylcyclohexylmethacrylate, cyclic ether acrylates, monocyclic acetal acrylate, acetoacetoxyethyl methacrylate, 2-acetoacetoxyethyl acrylate, 2-acetoacetoxypropyl methacrylate, 2-acetoacetoxypropyl acrylate, 2-acetoacetamidoethyl methacrylate, 2-acetoacetamidoethyl acrylate, 2-cyanoacetoxyethyl methacrylate, 2-cyanoacetoxyethyl acrylate, N(2-cyanoacetoxyethyl) acrylamide, 2-propionylacetoxyethyl acrylate, N(2-propionylacetoxyethyl) methacrylamide, N-4-(acetoacetoxybenzyl) phenylacrylamide, ethylacryloyl acetate, acryloylmethyl acetate, N-ethacryloyloxymethylacetoacetamide, ethylmethacryloyl acetoacetate, N-allylcyanoacetamide, methylacryloyl acetoacetate, N(2-methacryloyloxymethyl) cyanoacetamide, ethyl-a-acetoacetoxy methacrylate, N-butyl-N-acryloyloxyethylacetoacetamide, monoacrylated polyols, monomethacryloyloxyethyl phthalate, and mixtures thereof.

6. The underfill composition according to claim 1 wherein said oligomers of the ethylenically mono-unsaturated monomers contain at least one pendant or terminal ethylenic unsaturated group.

7. The underfill composition according to claim 6 wherein said oligomers of the ethylenically mono-unsaturated monomers contain two terminal unsaturated groups.

8. The underfill composition according to claim 6 wherein said oligomers of the ethylenically mono-unsaturated monomers have an average number of one to two unsaturated groups and a MW from 500 to 3000.

9. The underfill composition according to claim 1 wherein said oligomers of the ethylenically mono-unsaturated monomers are selected from the group consisting of bis-phenol-polyether acrylates, vinylether capped oligomer, acrylated epoxy resin, ethylenically unsaturated polyalkylethers, poly(cyclic) ether acrylates, polycyclic (ether) acetal acrylate, urethane acrylate oligomer, and mixtures thereof.

* * * * *